United States Patent
Kamath et al.

(10) Patent No.: US 8,456,210 B2
(45) Date of Patent: Jun. 4, 2013

(54) DELAY LOCKED LOOP WITH OFFSET CORRECTION

(75) Inventors: Anant Shankar Kamath, Bangalore (IN); SundaraSiva Rao Giduturi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 380 days.

(21) Appl. No.: 12/961,523

(22) Filed: Dec. 7, 2010

(65) Prior Publication Data

US 2012/0139595 A1   Jun. 7, 2012

(51) Int. Cl.
*H03L 7/06* (2006.01)
(52) U.S. Cl.
USPC ............................................ 327/158; 327/12
(58) Field of Classification Search
None
See application file for complete search history.

(56) References Cited

U.S. PATENT DOCUMENTS

| | | | | |
|---|---|---|---|---|
| 5,754,080 A * | 5/1998 | Chen et al. | | 331/25 |
| 6,011,822 A * | 1/2000 | Dreyer | | 375/376 |
| 6,498,537 B1 * | 12/2002 | Watanabe | | 331/25 |
| 6,667,643 B2 * | 12/2003 | Ko | | 327/158 |
| 7,755,397 B2 * | 7/2010 | El-Kik | | 327/12 |
| 2006/0226881 A1 * | 10/2006 | Jaussi et al. | | 327/158 |
| 2010/0117744 A1 * | 5/2010 | Takinami et al. | | 331/45 |

* cited by examiner

*Primary Examiner* — Cassandra Cox
(74) *Attorney, Agent, or Firm* — Ronald O. Neerings; Wade James Brady, III; Frederick J. Telecky, Jr.

(57) ABSTRACT

A delay locked loop (DLL) is calibrated to obtain a measure of offset error in the DLL. The offset error is compensated for in normal operation. In an embodiment, a current corresponding to the measure of offset is forced into one of a pair of paths carrying error signals representing a phase-mismatch between a reference signal and a feedback signal. In another embodiment, additional delay corresponding to the measure of offset is introduced on one of the pair of paths. Offset error is thus largely removed in normal operation of the DLL. The DLL employs an amplifier in place of a charge pump to remove systematic offset errors due to a charge pump. A phase detector in the DLL is designed such that an overlap interval of error outputs of the phase detector is at least half the period of the reference signal, thereby lending to high-frequency operation.

20 Claims, 6 Drawing Sheets

DELAY LOCKED LOOP WITH OFFSET CORRECTION

BACKGROUND

1. Technical Field

Embodiments of the present disclosure relate generally to delay locked loops (DLL), and more specifically to a delay locked loop with offset correction.

2. Related Art

A delay locked loop (DLL) is a closed-loop feedback circuit that adjusts the phase of its output to achieve a desired phase difference between the output and an input signal. The adjustment is typically done based on one or more error signals generated as a comparison result of the phases of the output and the input signal. The input signal and the output are typically clock signals. In addition, a DLL may also provide one or more outputs as phase-delayed versions of the input signal.

With respect to delay locked loops, offset refers to mismatches in the corresponding circuit portions in the DLL, such as, for example, in the phase detector and/or charge pump circuit in the DLL, which lead to a non-zero error being generated even when the output and the input signal are perfectly in-phase. Such offset generally results in the output signal and the input signal not being exactly in phase when the DLL is in the locked condition. Further, due to such offset, the phase-delayed versions of the input signal may not have the desired phase relationship with the input signal. In addition to offset errors, operation of a DLL may be limited by other design aspects such as, for example, the design of the phase detector used in the DLL.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A delay locked loop (DLL) includes a phase detector with a reference input and a feedback input. The phase detector is designed to generate a pair of error signals representing a phase difference between signals received on the reference input and the feedback input. The DLL includes an amplifier having a first input and a second input. The amplifier is designed to amplify the difference of voltages at the first input and the second input. A first error signal of the pair of error signals is provided on a first path to the first input, and a second error signal of the pair is provided on a second path to the second input. In a calibration phase of the DLL, an identical signal is provided on both of the reference input and the feedback input. An output of the amplifier is examined to identify a first comparison result between the voltages on the first input and the second input. An electrical characteristic of the signal on at least one of the first path and the second path is changed until a second comparison result is obtained at the output of the amplifier.

A delay locked loop (DLL) includes a phase detector, an amplifier, a measurement block and a correction block. The phase detector has a reference input and a feedback input, and is designed to generate a pair of error signals representing a phase difference between signals received on the reference input and the feedback input. The amplifier has a first input and a second input, the first input being coupled via a first path to receive a first error signal in the pair and the second input coupled via a second path to receive a second error signal in the pair. The amplifier is designed to amplify the difference of voltages at the first input and the second input. In a configuration phase of the DLL, a same signal is provided on both of the reference input and the feedback input, the measurement block being coupled to an output of the amplifier to identify a first comparison result between voltages on the first input and the second input of the amplifier. In the calibration phase, the correction block operates to change an electrical characteristic of the signal on at least one of the first path and the second path until a second comparison result is obtained at the output of the amplifier.

A phase detector in a delay locked loop (DLL) receives a reference signal on a reference input and a feedback signal on a feedback input. The phase detector generates a pair of error signals representing a phase difference the reference signal and the feedback signal. The phase detector is implemented using a pair of flip-flops, a NAND gate and a pair of AND gates. A first flip-flop in the pair of flip-flops has a data input connected to a power supply terminal, and a clock input connected to receive the reference signal. The output of the first flip-flop is a first error signal in the pair of error signals. A second flip-flop in the pair of flip-flops has a data input connected to the power supply terminal, and a clock input connected to receive the feedback signal. The output of the second flip-flop is a second error signal in the pair of error signals. The NAND gate is connected to receive the reference clock and the feedback clock as inputs. A first AND gate in the pair of AND gates is connected to receive the first error signal and the second error signal as inputs. A second AND gate in the pair of AND gates is connected to receive the outputs of the NAND gate and the AND gate as inputs. An output of the second AND gate is connected to the asynchronous clear inputs of each of the first flip-flop and the second flip-flop.

A phase detector in a delay locked loop (DLL) receives a reference signal on a reference input and a feedback signal on a feedback input, and generates a pair of error signals representing a phase difference between signals received on the reference input and the feedback input. The pair of error signals includes a first error signal and a second error signal. The phase detector is designed to cause the first error signal to transition to a logic high level at a rising edge of the reference signal, the second error signal to transition to a logic high level at a rising edge of the feedback signal, and each of the first error signal and the second error signal to transition to a logic low at a falling edge of either the reference signal or the feedback signal.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

The drawing in which an element first appears is indicated by the leftmost digit(s) in the corresponding reference number.

DETAILED DESCRIPTION

Various embodiments are described below with several examples for illustration.

1. Example Component

Figure 1A:
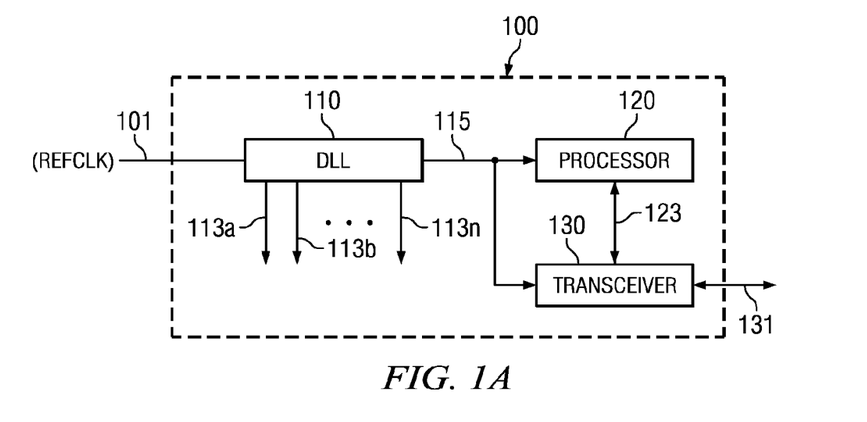
FIG. 1A is a block diagram illustrating the details of an example component in which several embodiments can be implemented.

FIG. 1A is a block diagram of an example component in which several embodiments of the present disclosure can be implemented. The diagram shows integrated circuit (IC) 100 containing delay locked loop (DLL) 110, processor 120 and transceiver 130. The specific blocks of IC 100 are shown merely by way of illustration, and typical implementations of IC 100 may contain more or fewer blocks.

Processor 120 receives a clock on path 115. The operations of processor 120 may be synchronized with respect to clock 115. Alternatively, although not shown in FIG. 1, processor 120 may instead receive one or more of the delayed clocks 113a through 113n to enable various internal operations. Processor 120 may generate data to be processed by transceiver 130, and provide the data to transceiver 130 on path 123. Processor 120 may receive data from transceiver 130 also on path 123. In general, processor 120 operates to provide various features designed to be provided by a system or device containing IC 100. When implemented in a wireless communications device, processor 120 may implement corresponding baseband processing operations.

Transceiver 120 may perform several operations to transmit and receive modulated signals on/from path 131. Accordingly, transceiver 120 may receive data from processor 120, modulate a carrier with the data, and transmit the modulated signal on path 131. Path 131 may be connected to an external antenna, which may then transmit the modulated signal on a wireless medium. Transceiver 120 may receive a modulated signal on path 131 (e.g., from a receive antenna), demodulate the signal, and forward the data obtained from the demodulation to processor 120. Transceiver 130 receives clock 115, and may generate various internal clocks based on clock 115. Alternatively, although not shown in FIG. 1, transceiver 130 may instead receive one or more of the delayed clocks 113a through 113n to enable various internal operations.

DLL 110 receives REFCLK 101 from an external source, and operates to phase-lock output clock 115 with respect to the phase of REFCLK 101. DLL 110 typically contains multiple serially-connected delay elements internally, and generates delayed clocks 113a through 113n as the outputs of corresponding delay elements. The specific number of delay elements, and therefore the number 'n' of delayed clocks 113a-113n is generally implementation specific, and may be selected to provide a total delay between REFCLK 101 and clock 115 of (k*360) degrees, k being an integer.

Typically, in DLL 110, the phases of REFCLK 101 and output clock 115 are compared, and one or more error signals representing a phase error between signals 101 and 115 are generated. The error signal is typically converted to a voltage that controls the individual delays of delay elements in a delay line. The output of the delay line is provided as output signal 115, and also serves as a feedback signal for the comparison noted above.

Figure 1B:
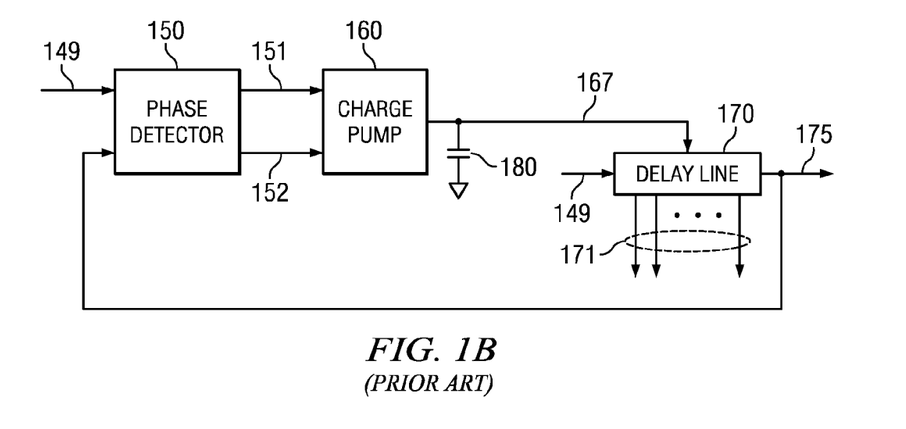
FIG. 1B is a diagram depicting a prior implementation of a DLL.

FIG. 1B is a diagram depicting a prior implementation of a DLL. Delay line 170 may contain multiple delay elements and generates clock 175 and delayed clocks 171 from an input clock 149. Input clock 149 and output clock 175 correspond respectively to REFCLK 101 and clock 115 of FIG. 1. Phase detector 150 compares the phases of clocks 149 and 175 and generates error signals 151 and 152, generally denoted as UP and DOWN signals respectively. The relative widths of signals 151 and 152 indicate which of clocks 149 and 175 is leading (or lagging) the other. The UP and DOWN signals operate respective current sources in charge pump 160, which in turn sources or sinks corresponding currents from capacitor 180. The voltage across capacitor 180 (i.e., on path 167) controls the delay of the delay elements in delay line. Closed loop feedback operates to align the phase of clock 149 to be synchronized with that of clock 175.

Mismatch in the signal paths from node 149 to node 151, and from node 175 to node 152 due, for example, to unequal path delays in internal components in phase detector 150 results in an offset error. Another potential source of mismatch is the unequal values of currents sourced and sinked by respective current sources in charge pump 160. Such sources of mismatch cumulatively result in an offset error, with the result that clocks 149 and 175 are not exactly aligned in the steady state of operation. Specifically, misalignment may be a substantial portion of a clock cycle of clock 149 (or clocks 171 and 175) at higher frequencies. Thus, offset errors may restrict the operation of DLLs to comparatively lower frequencies (of clocks 149, 171 and 175), and may need to be corrected.

2. Offset Correction

Figure 2:
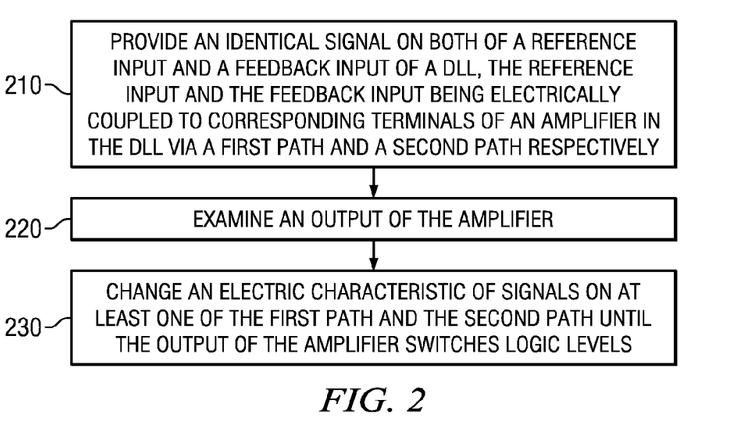
FIG. 2 is a flow diagram illustrating the manner in which offset errors in a DLL are corrected in an embodiment.

FIG. 2 is a flow diagram illustrating the manner in which offset errors in a DLL are corrected in an embodiment. The flow diagram is described with respect to DLL 110 of FIG. 1A merely for illustration. However, various features described herein can be implemented in other devices and/or environments and using other components, as will be apparent to one skilled in the relevant arts by reading the disclosure provided herein. Further, the steps in the flow diagrams are described in a specific sequence merely for illustration. Alternative embodiments using a different sequence of steps can also be implemented without departing from the scope and spirit of several aspects of the present disclosure, as will be apparent to one skilled in the relevant arts by reading the disclosure provided herein.

In step 210 of the flow diagram, an identical (or same) signal is provided as an input on both of a reference input (101) and a feedback input (115) of DLL 110. The reference input and the feedback input are electrically coupled to a first input and a second input respectively of an amplifier in DLL 110 via a first path and a second path respectively. Control then passes to step 220.

In step 220, an output of the amplifier is examined to identify a comparison result of a comparison of the voltages on the first input and the second input. Control then passes to step 230.

In step 230, an electrical characteristic of signals on at least one of the first path and the second path is changed. An electrical characteristic, as used herein, refers to a property of an electrical signal, such as for example, power, voltage level, or current. Step 220 and step 230 may then be repeated until the output of the amplifier switches logic levels.

A measure of the change required in the electrical characteristics on the first path and/or the second path is proportional to, and thus represents, the offset in DLL 110. Steps 210, 220 and 230 may be performed in a calibration phase of DLL 110. The change in the electrical characteristics is then maintained in the corresponding one of the first path and the second path when DLL 110 is operated normally.

The operations of the steps described above are illustrated next with respect to a DLL in an embodiment.

3. DLL with Offset Calibration

Figure 3:
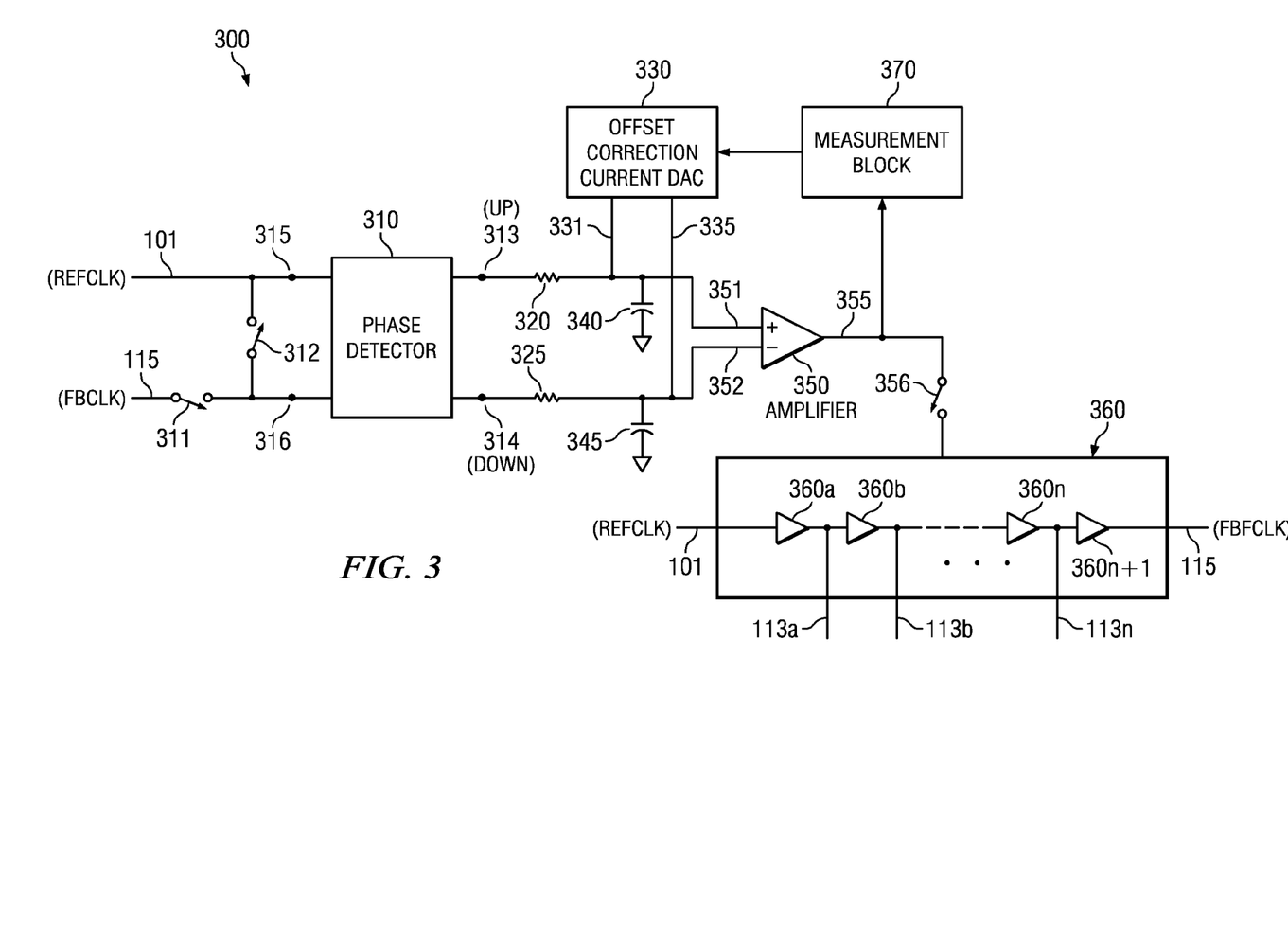
FIG. 3 is a block diagram of a DLL in an embodiment.

FIG. 3 is a block diagram of a DLL in an embodiment. DLL 300, which may be used in place of DLL 110 of FIG. 1, is shown containing phase detector 310, resistors 320 and 325, capacitors 340 and 345, offset correction current DAC (digital-to-analog converter) 330, amplifier 350, delay line 360, measurement block 370, and switches 311, 312 and 356.

Delay line 360 is shown containing delay elements 360a through 360n+1. Delay element 360a receives REFCLK 101 as input and generates a phase-delayed clock 113a. Each of the other delay elements similarly delays a signal received as input and provides a delayed signal. Thus, clocks 113b-113n and clock 115 (FBCLK) are delayed versions of clock 101 (REFCLK). Any of clocks 113a-113n and 115 may be used as an output of DLL 300. The specific number 'n' of delay elements in delay line 360 may be based on the total phase delay required between clocks 101 and 115. In an embodiment, the number 'n' is selected to ensure that a phase delay of 360 degrees is achievable between the phases of clocks 101 and 115. However, in other embodiments, the number may be selected to enable other values of phase delay, and may equal a value enabling a phase delay of k*360, wherein k is an integer. When DLL 300 is in the 'lock' condition the phases of clocks 101 and 115 are ideally aligned, i.e., the phase difference is (ideally) k*360 degrees.

Phase detector 310 receives clocks 101 and 115 as inputs on respective input nodes 315 (reference input) and 316 (feedback input) during normal operation. Normal operation of DLL 300 refers to its operation to provide phase-locked output 115 with respect to clock 101, as against operations in a calibration phase, as described below. Phase detector 310 generates error signals 313 (UP) and 314 (DOWN) indicative of the phase error between clocks 101 and 115. The pulse width of one of the UP and DOWN error signals (which are in the form of pulses) will have a larger pulse-width depending on whether the phase of REFCLK leads or lags the phase of FBCLK.

Resistor 320 and capacitor 340 form an RC filter. Resistor 325 and capacitor 345 form another RC filter. The UP and DOWN pulses are low-pass filtered by the respective RC filters noted above. The respective filtered values are provided as inputs to the non-inverting input (351) and inverting input (352) of amplifier 350. The resistance values of resistors 320 and 325 are implemented to be equal. Similarly, the capacitances of capacitors 340 and 345 are implemented to be equal.

The signal path from node 101 to node 351 (via the corresponding internal signal path traversed by signal 101 in phase detector 310) is referred to herein as a 'first path', and the signal path from node 115 to node 352 (via the corresponding internal signal path traversed by signal 115 in phase detector 310) is referred to herein as a 'second path'.

Amplifier 350, which may be implemented as an operational amplifier (OPAMP), amplifies the difference and provides the amplified output on its output terminal 355. Amplifier 350 is operated in an open-loop configuration. Amplifier 350 is designed to provide a very high gain (a voltage gain of 1000, in an embodiment) in the calibration phase of DLL 300, as described below. In normal operation, amplifier 350 is designed to provide a comparatively smaller gain. An embodiment of amplifier 350 is described in sections below. In an embodiment, the voltage on output 355 of amplifier 350 is used to control the value of a power supply provided for the operation of each delay element in delay line 360. The value of the power supply controls the delay provided by each delay element. Larger the value of the power supply, smaller is the delay, and vice versa. However, in other embodiments, other techniques to control the delay provided by the delay elements (based on output 355) can be used instead, as will be apparent to one skilled in the relevant arts.

Offset correction current DAC 330 is designed to inject currents on outputs 331 and 335 (respectively connected to nodes 351 and 352 of amplifier 350). In an embodiment, offset correction current DAC 330 is implemented to have multiple current sources, each generating a fixed current output. The number of current sources whose outputs are combined and provided on one of paths 331 and 335 is based on the value of a digital code, either generated within offset correction current DAC 330 or provided as an input to offset correction current DAC 330. In an embodiment offset correction current DAC 330 is implemented with a single set of current sources controllable by the digital code. The current generated is then steered into one of outputs 331 and 335, as desired. In another embodiment, offset correction current DAC 330 contains two sets of current sources, each controllable by corresponding digital codes. The outputs of the two sets are respectively connected to path 331 and 335. Offset correction current DAC 330 may be implemented in a known way.

The injection of current into the first path (path from node 313 to node 351) changes the voltage at node 351. The injection of current into the second path (path from node 314 to node 352) changes the voltage at node 352. Hence, the injection of the current(s) may be viewed as changing an electrical characteristic of the signal on the corresponding path. As noted above, the term "electrical characteristic" is used herein to refer to a property of an electrical signal, such as for example, power, voltage level, or current. The injection of current into node 351 or 352 increases the voltage at that node, and thus changes an electrical characteristic (voltage here) of the signal on the corresponding path.

Measurement block 370 measures the logic value of output 355. Measurement block 370 may be designed to merely forward the measured logic value. Alternatively, measurement block 370 may be implemented to contain a digital code generator whose digital code output is provided to offset correction current DAC 330. In such an embodiment, during a calibration phase, the digital code generator may be designed to increment the code value in each iteration of the calibration phase, as described below. Measurement block 370 may also provide data to offset correction current DAC 330 specifying which one of paths 331 and 335 a current corresponding to the code is to be injected on. Measurement block 370 may be implemented in a known way.

It may be observed that DLL 300 is implemented without a charge pump. Hence, there is no offset error contribution due to potential mismatch in current sources of a charge pump, had a charge pump been used. Instead of a charge pump, DLL 300 employs amplifier 350. Further, the use of a charge pump may have required logic inversion of one or both of the UP and DOWN signals, thereby incurring random offset errors due to the need to use logic inverters. Such offset error components are also avoided in DLL 300. DLL 300 is therefore Type-0 DLL, and therefore systematic offset is eliminated, and offset due to random mismatch sources is reduced.

Potential sources of offset error in DLL 300 are now noted. One potential source of offset error is unequal delay in internal paths (internal to phase detector 310) between nodes 101 and 313, and nodes 115 and 314 (with switch 311 closed). Phase detector 310 is typically implemented using digital elements such as flip-flops, inverters, digital delay blocks, etc. Unequal delay in the digital elements between nodes 101 and 313, and nodes 115 and 314 results in an offset error. Such errors are typically random, and may vary randomly from part to part (different process corners), and with operating voltage and temperature (i.e., with PVT).

Another potential source of offset in DLL 300 is input-referred offset errors in amplifier 350. Input-referred offset errors in amplifier 350 refer to offsets due to mismatch in the internal circuitry processing the respective inputs at the inverting and non-inverting input terminals of amplifier 350. To clarify, assuming input voltages at nodes 351 and 352 are identical, output 355 of amplifier should ideally be at mid-rail, i.e., half the power supply voltage provided for operation of amplifier 350 (power supply connections not shown). When voltages at inputs 351 and 352 are unequal, output 355 is either a logic high (voltage equal to power supply voltage) or a logic low (voltage is at ground potential). When input voltages 351 and 352 are exactly equal, output 355 should ideally be at mid-rail. However, in practice, a small differential voltage may need to be applied across nodes 351 and 352 to force output 355 to mid-rail. The differential voltage is termed as the input offset voltage. The input offset voltage in the amplifier is caused by statistical mismatches or variations internal to the amplifier. The offset error due to amplifier 350 adds to the offset error due to unequal delays in phase detector 310, and results in a net offset error.

The net offset error in DLL 300 is 'measured' in a calibration phase/mode of DLL 300, and is corrected (or compensated for) in normal operation.

In the calibration mode, switches 311 and 356 are open, and switch 312 is closed. At the start of the calibration phase, the digital code in offset correction current DAC 330, and therefore the output currents on paths 331 and 335, are set to zero. REFCLK is applied to both inputs 315 and 316 of phase detector 310. The frequency of REFCLK may be set to a value that is to be used in normal operational mode of DLL. Amplifier 350 may be operated in a high gain mode, as described in sections below, although such operation is not necessary.

Measurement block 370 provides to offset correction current DAC 330 the logic state of output 355 of amplifier 350. A logic high or a logic zero value of output 355 is indicative of the sum of offset errors in phase detector 310 and amplifier 350, as also noted above.

Depending on the specific logic value (high or low) of output 355, offset correction current DAC 330 increments the digital code by one (or some other non-zero value as desired), and generates a current in the corresponding one of paths 331 and 335. Alternatively, offset correction current DAC 330 may directly receive an incremented digital code from measurement block 370, as well as data specifying the path (331 or 335) on which a current corresponding to the incremented digital code is to be injected. A current 'I' injected into either of paths 331 and 335 contributes to a 'correction' voltage (at the corresponding one of nodes 351 or 352) equal to a value I*(Rfilt+Rout), wherein Rfilt is the value of the resistance of resistor 320 (or 325), and Rout is the value of the looking-in resistance (looking-in towards phase detector 310) at either of nodes 313 and 314. Assuming Rout is much smaller than Rfilt, the correction voltage equals I*Rfilt.

Which one of the paths 331 and 335 the current is output on depends on the logic value of output 355. Thus, for example, a logic high value of output 355 indicates that the voltage on node 351 is greater than that on node 352, which in turn indicates that the pulse width of signal UP is wider than that of signal DOWN. The difference in the pulse widths is in turn indicative of delay mismatch in the internal components in phase detector 310. If output 355 is a logic one, offset correction current DAC 330 injects a current on path 335 (and no current on path 331). The value of the current corresponds to the step size in offset correction current DAC 330. On the other hand, a logic low value of output 355 indicates that the voltage on node 352 is greater than that on node 351, which in turn indicates that the pulse width of signal DOWN is wider than that of signal UP. Accordingly, offset correction current DAC 330 injects a current on path 331 (and no current on path 335) with a value corresponding to the step size.

With the new setting of current into the corresponding one of nodes 331 and 335, measurement block 370 again measures the logic value of output 355, and provides the value to offset correction current DAC 330. Offset correction current DAC 330 may then increase the value of current output on the corresponding path—331 or 335. The determination of the logic value of output 355 and the increase (or change in general) in the value of the current output on the corresponding one of nodes 331 and 335 is iteratively performed until a change in logic value of output 355 is determined by measurement block 370. In the iterations, the value of the current on the corresponding one of paths is changed in steps equaling the value of the step size in offset correction current DAC 330. The step size may be implemented to be sufficiently small to enable fine correction of the offset error.

The digital code obtained corresponding to the iteration in which output 355 changes logic states is a measure of the offset error due to phase detector 310 and amplifier 350, and is referred to herein as the 'correction code' (first magnitude). Offset correction current DAC 330 records (stores) the correction code for use in normal operation of DLL 300.

In an alternative embodiment, measurement block 370 may increment a digital code generated by a code generator contained within, and provide the digital code to offset correction current DAC 330. The digital code generator may be designed to increment the code value in each iteration of the calibration phase. Measurement block 370 may also provide data to offset correction current DAC 330 specifying which one of paths 331 and 335 a current corresponding to the code is to be injected on. In response to the digital code and data received from measurement block 370, offset correction current DAC 330 generates a corresponding current on the corresponding one of paths 331 and 335. The determination of the logic value of output 355, incrementing of the digital code and injection of the current on one of paths 331 and 335 may be performed iteratively until the logic level of output 355 changes logic state. The final correction code may then be provided as an output of offset correction current DAC 330 during normal operation of DLL 300, as described above.

In normal operation, switch 312 is open, and switches 311 and 356 are closed, and DLL operates as a feedback loop to align the phase of FBCLK with REFCLK. In normal operation, offset correction current DAC 330 generates a current in the corresponding one of paths 331 and 335 with a value corresponding to the correction code recorded in the calibration phase. As a result the offset error is corrected.

It is noted that at steady state (i.e., when REFCLK and FBCLK should ideally be perfectly synchronized), the voltage on node 355 may need to be at a non-zero value to set the corresponding steady state value of delay for the delay elements in delay line 360. Hence, while the offset correction technique described above operates to minimize (or reduce to zero) the offset error, at steady state a small phase delay may still exist between the phases of REFCLK and FBCLK. Such a small error may be within an error margin required for most high-speed operation applications of DLL 300. As an illustration, assuming the phase delay between REFCLK and FBCLK at steady state (i.e., when DLL 300 is in the locked condition) is about 50 picoseconds without offset correction, the application of offset correction in the manner noted above may reduce the phase delay to under 5 picoseconds.

The offset calibration described above may automatically be performed on power-ON of DLL 300 (or the IC containing DLL 300). Alternatively, the calibration may be performed manually as well.

Figure 4:
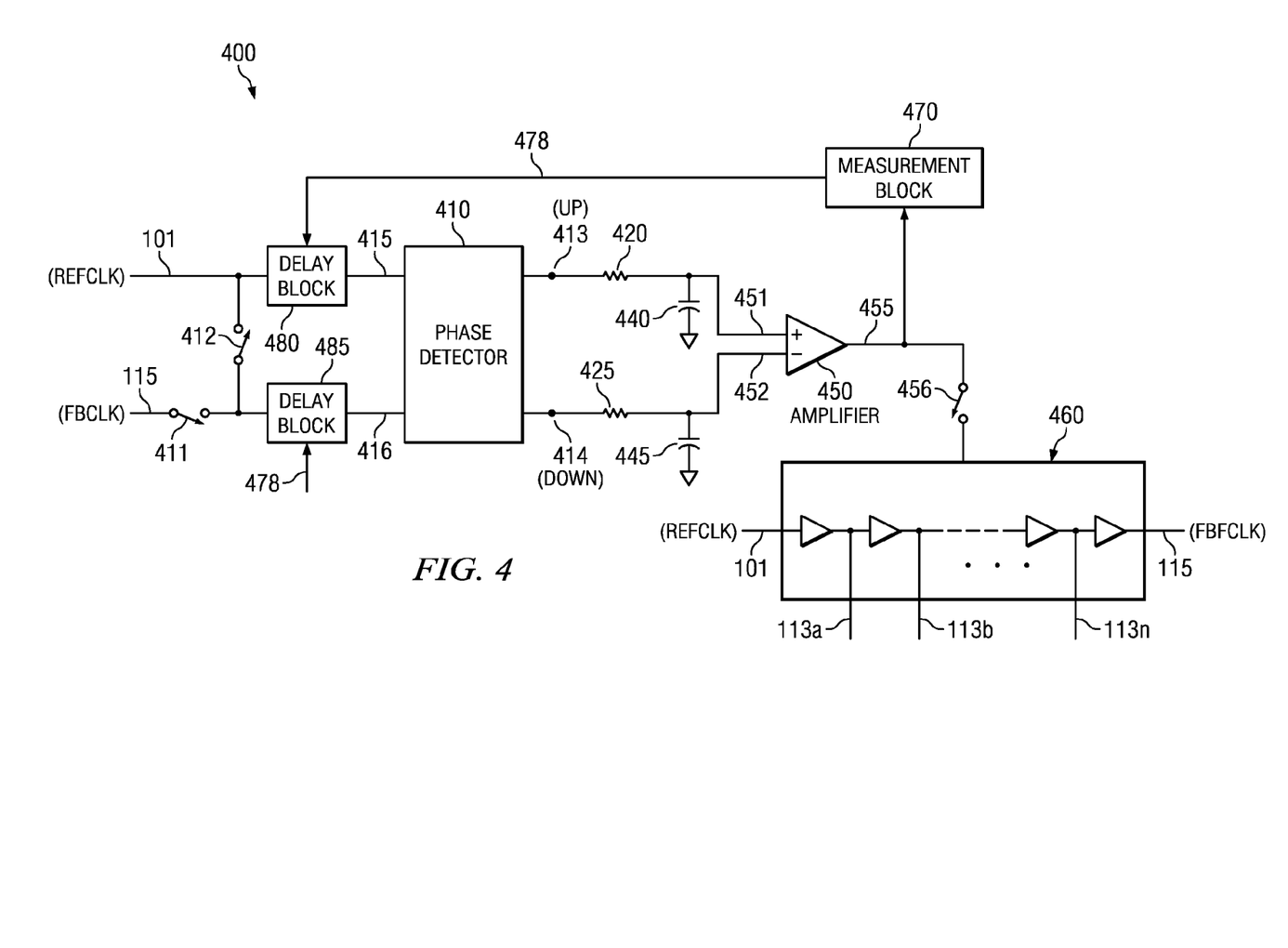
FIG. 4 is a block diagram of a DLL in another embodiment.

FIG. 4 is a diagram illustrating the details of a DLL in another embodiment. DLL 400, which may be used in place of DLL 110 of FIG. 1, is shown containing phase detector 410, resistors 420 and 425, capacitors 440 and 445, amplifier 450, delay line 460, measurement block 470, switches 411, 412 and 456, and delay blocks 480 and 485. Phase detector 410, amplifier 450, measurement block 470 and delay line 460 are implemented identical or similar to phase detector 310, amplifier 350, measurement block 370 and delay line 360 of FIG. 3. RC filters formed by resistor 420 and capacitor 440, as well as resistor 425 and capacitor 445 orate similar to the corresponding RC filters of FIG. 3. Each of delay blocks 480 and 485 is implemented to provide a delay from input to output that is programmable by a digital code. Delay blocks 480 and 485 may be implemented in a known way.

Delay block 480 is connected between node 101 (REFCLK) and the reference input (415) of phase detector 410, and provides a delay to REFCLK, the value of delay being programmable via path 478. Delay block 485 is connected between node 115 (FBCLK) and the feedback input (416) of phase detector 410, and provides a delay to FBCLK, the value of delay being programmable via path 478.

The signal path from node 101 to node 451 (via the corresponding internal signal path traversed by signal 101 in phase detector 410) is the equivalent in DLL 400 of the first path noted with respect to DLL 300, and will also be referred to herein as the 'first path'. Path from node 115 to node 452 (via the corresponding internal signal path traversed by signal 115 in phase detector 410) is the equivalent in DLL 400 of the second path noted with respect to DLL 300, and will also be referred to herein as the 'second path'. The delay due to delay block 480 changes the voltage at node 451. The delay due to delay block 485 changes the voltage at node 452. Hence, the delay of the respective signals may be viewed as changing an electrical characteristic of the signal on the corresponding path.

In the calibration phase, switches 411 and 456 are open and switch 412 is closed. REFCLK is provided at a frequency equal to the frequency at normal operation. Initially, the delay in delay block 480 is programmed to be equal to the delay in delay block 485, each delay being set to a minimum value obtainable from the delay blocks. Measurement block 470 checks the logic value of output 455 of amplifier 450, and increments the value of a digital code generated internally. In addition, measurement block 470 generates data specifying which one of delay block 480 and 485 is to now provide an increased delay compared to the other. Measurement block 470 provides the digital code as well as the data on path 478 to each of delay blocks 480 and 485. In response, the corresponding one of delay blocks 480 and 485 introduces an additional internal delay. Thus, for example, if output 455 is a logic high, delay block 480 adds a delay specified by the received digital code. On the other hand, if output 455 is a logic low, delay block 485 adds a delay specified by the received digital code. The determination of the logic value of output 455, incrementing of the digital code in measurement block 470, and incrementing of the delay in the corresponding one of delay blocks 480 and 485 may be performed iteratively until the logic level of output 455 changes logic state. The final correction code (first magnitude) obtained in measurement block 470 corresponding to the iteration in which output 455 switches logic states may then be programmed permanently in the corresponding one of delay blocks 480 and 485 during normal operation of DLL 400.

The calibration techniques employed in DLL 300 and DLL 400 (i.e., the injection of current in DLL 300 by offset correction current DAC 330, and the changing of the delay in delay block 480 or 485) may generically be viewed as changing an electrical characteristic of the signal on one of the first path and the second path, as also noted above. Offset correction current DAC 330 of DLL 300 may be viewed as a correction block. Similarly, the combination of delay blocks 480 and 485 of DLL 400 may be viewed as a correction block.

The techniques described above with respect to DLLs 300 and 400 may provide several benefits. In DLL 300, offset correction is applied directly at output of RC filters. Such an approach is simpler to implement than, for example, attempting to correction for the offset inside amplifier 350 or using other techniques such as through capacitive offset storage. In both of DLLs 300 and 400, since amplifier 350 (or 450) is included in the calibration circuit, offsets due to the amplifiers are also corrected for. In DLL 300, offset error is corrected for by applying a correction voltage, which remains fairly invariant across operating temperature. Another advantage with both DLLS 300 and 400 is that phase detectors 310 and 410 may be implemented with small-sized components. Mismatches in smaller-sized components may inherently be higher. However, the offset correction technique allows use of such small-sized components. The use of smaller sized components also provides the benefit of reducing power consumption in the phase detectors and therefore the DLLs.

In an embodiment, phase detector 310 and phase detector 410 are implemented to provide several advantages, as described next.

4. Phase Detector

Figure 5:
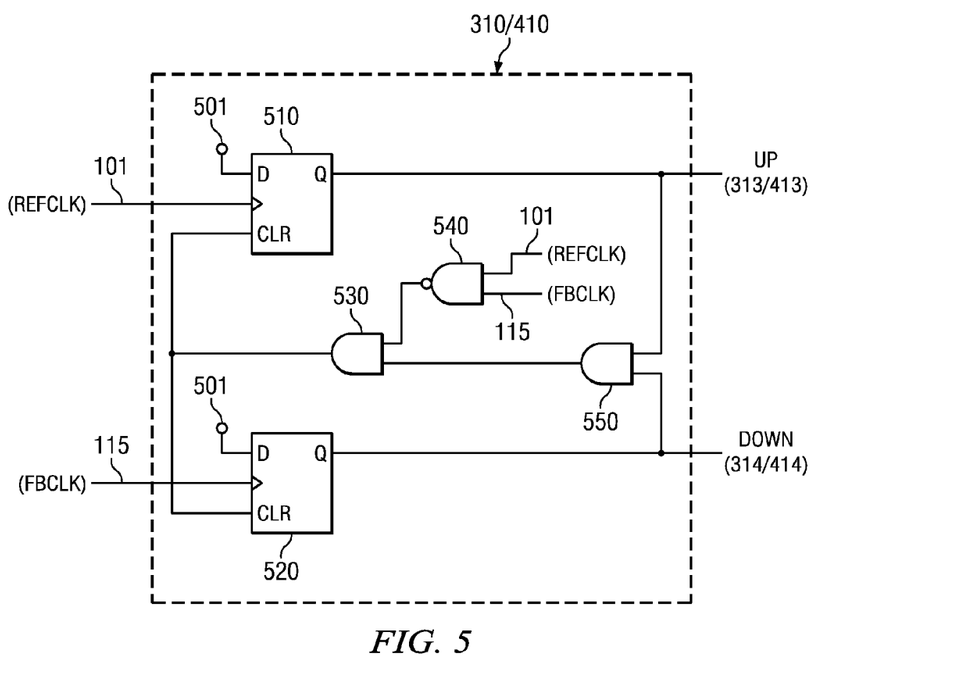
FIG. 5 is a block diagram of a phase detector used in a DLL in an embodiment.

FIG. 5 is a block diagram of a phase detector in an embodiment. Each of phase detectors 310 and 410 may be implemented as the circuit of FIG. 5. Phase detector 310 (or 410) is shown containing flip-flops 510 and 520, AND gate 530 and 550 and NAND gate 540.

REFCLK is provided as the clock input of flip-flop 510. The D input of flip-flop 510 is connected to a power supply terminal (501), and is therefore permanently wired as a logic high. UP signal (313 of DLL 300 or 314 of DLL 400) is the Q output of flip-flop 510. FBCLK is provided as the clock input of flip-flop 520. The D input of flip-flop 520 is connected to power supply terminal 501, and is therefore permanently wired as a logic high. DOWN signal (314 of DLL 300 or 414 of DLL 400) is the Q output of flip-flop 520. The asynchronous clear inputs (CLR) of flip-flops 510 and 520 are connected to the output of AND gate 530. NAND gate 540 receives REFCLK and FBCLK as inputs. AND gate 550 receives UP and DOWN signals as inputs. The output of AND gate 550 and NAND gate 540 are provided as the inputs to AND gate 530.

Figure 6A:
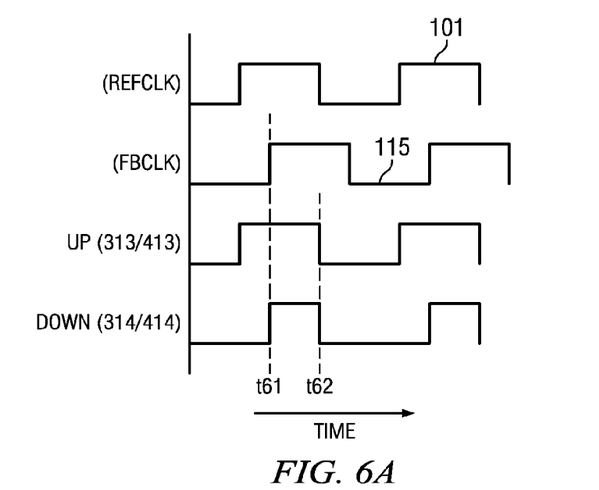
FIGS. 6A and 6B are example timing diagrams used to illustrate the operation of a phase detector.
Figure 6B:
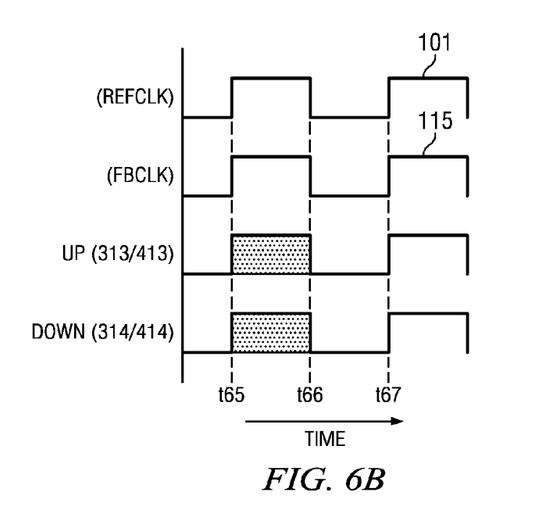

FIGS. 6A and 6B are example timing diagrams used to illustrate the operation of phase detector 310/410. With respect to FIG. 6A, signal UP goes high in response to REFCLK going high. FBCLK is shown lagging REFCLK. When FBCLK goes high, signal DOWN goes high (at t61) in response. Either of REFCLK or FBCLK going low sets the output of NAND gate 540 to logic high. When UP and DOWN are both high (as in the interval t61 to t62), the output of AND gate 550 is a logic high. Hence, at t62, the output of AND gate 530 goes high, thereby clearing both flip-flops 510 and 520. In response, both UP and DOWN go low, as shown happening at t62. Thus, in the embodiment of phase detector 310 (or 410) shown in FIG. 5, the reset or clear of both UP and DOWN signals occurs in response to one of REFCLK and FBCLK going low.

FIG. 6B illustrate waveforms of signals REFCLK, FBCLK, UP and DOWN when the corresponding DLL (300 or 400) is in the 'lock' condition (steady state). At steady state, REFCLK and FBCLK are in phase, or at least have a very small phase misalignment with respect to each other. The operation of the circuit of FIG. 5 may be examined to note that at steady state signals UP and DOWN each is high for a period equal to (Tperiod/2), wherein Tperiod is the period of REFCLK or FBCLK. Thus, the overlap (e.g., as in interval t65 to t66) in signals UP and DOWN in the steady state of operation of a DLL using the phase detector of FIG. 5 equals (approximately, and not including delay in the logic gates of FIG. 5) half the period of the reference or feedback clock signal of the DLL. The combinatorial logic formed by gates 530, 540 and 550 can be optimized to minimize delay of signals passing through them.

One benefit of the implementation as in FIG. 5 is that the operational frequency (frequency of REFCLK and FBCLK) can be as high as (½*Toverlap), wherein Toverlap is the overlap interval of the UP and DOWN signals at steady state. Toverlap equals half of Tperiod.

Another benefit of the scheme of FIG. 5 is that an overlap time (Toverlap) of at least Tperiod/2 ensures a common mode voltage at input of amplifier 350 (or 450) of half the power supply (501). As a result, design of amplifier 340 (or 450) is simplified and the amplifiers can be designed for a high gain. Further, since the phase detector of FIG. 5 is symmetrical by design, systematic offsets are close to zero. Overlap time Toverlap is lesser (than Tperiod/2) for non-zero phase errors between REFCLK and FBCLK. However, the lowered overlap time may not be of concern at non-zero phase errors.

At steady state, the overlap time of at least Tperiod/2 may be desirable in charge pump based DLL implementations as well. Accordingly, in an embodiment, a DLL is implemented to include the phase detector of FIG. 5 and a charge pump. In the embodiment, the charge pump replaces an amplifier (e.g., the amplifiers of DLLs 300 and 400).

Figure 7A:
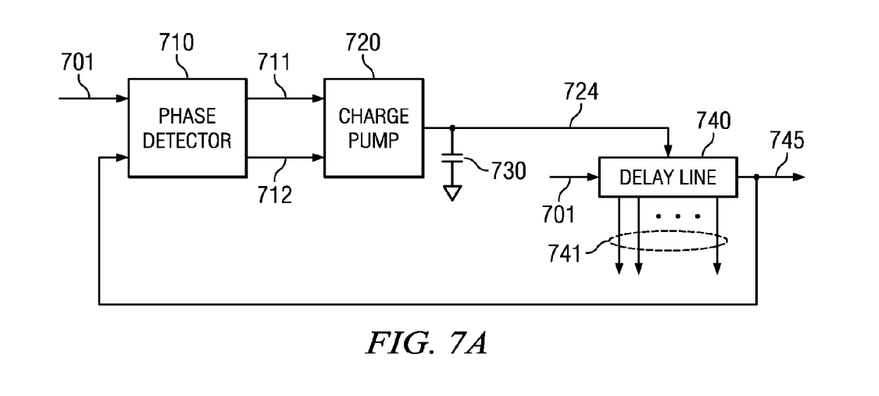
FIG. 7A is a block diagram of a DLL in an alternative embodiment that employs a charge pump.

FIG. 7A is a block diagram of a DLL implemented to include the use of the phase detector of FIG. 5 and a charge pump. Phase detector 710 is implemented as shown in FIG. 5, and receives a reference clock on path 701 and a feedback clock on path 745. Signal 711 represents an inversion of UP signal (313/413) of FIG. 5. Signal 712 is the same as signal DOWN of FIG. 5. Charge pump 720 is implemented using current sources, and sinks current from or sources current to control node 724. The voltage across capacitor 730 controls the delay of delay elements in delay line 740. Delay line 740 receives reference clock 701 and generates feedback (or output) clock 745, and multiple phase delayed clocks jointly labeled as 741.

The phase detectors of FIG. 7A and prior phase detector 150 of the prior DLL of FIG. 1B are implemented differently. In prior phase detector 150, the duration of overlap of UP and DOWN signals is controlled by a delay line. Consequently, variations in delay (due to PVT) in the internal components may require the operational frequency of the prior DLL of FIG. 1B DLL to be limited to around (1/(4*Toverlap)).

Figure 7B:
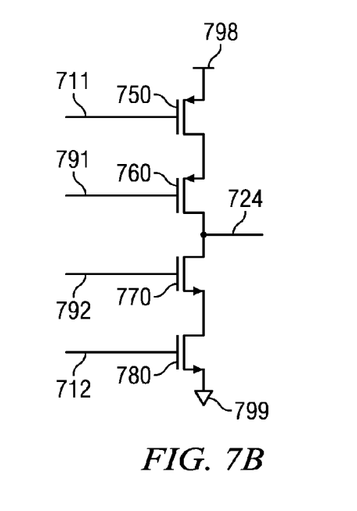
FIG. 7B is a circuit diagram of a charge pump used in a DLL in an embodiment.

FIG. 7B is a circuit diagram of charge pump 720 in an embodiment. Charge pump 720 is shown containing P-type MOS transistors (PMOS) 750 and 760, and N-type MOS transistors (NMOS) 770 and 780. The respective base terminals 791 and 792 of transistors 760 and 770 are connected to corresponding bias voltages, not shown. Terminals 798 and 799 respectively represent power supply and ground terminals. When transistor 750 is ON and transistor 780 is OFF, charge pump 720 sources a current into path 724. When transistor 750 is OFF and transistor 780 is ON, charge pump 720 sinks a current from path 724. When both of transistors 750 and 780 are ON, the operation of charge pump 720 does not affect the voltage on path 724.

5. Amplifier

Figure 8:
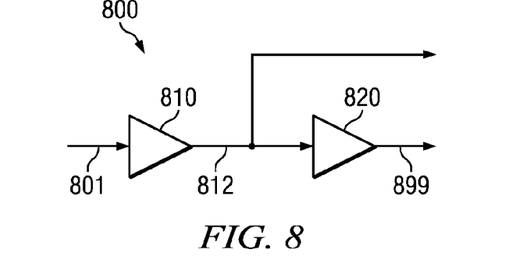
FIG. 8 is a block diagram of an amplifier used in a DLL in an embodiment.

FIG. 8 is a block diagram of an amplifier used in a DLL in an embodiment. Amplifier 800 which represents each of amplifier 350 and amplifier 450 is shown containing gain stages 810 and 820. Amplifier 800 receives an input on path 801. In the calibration phase of operation of DLL 300 (or 400), amplifier 800 is used in high gain mode, and the output 899 of amplifier 800 is used. Thus, referring to FIGS. 3 and 4, output 355 (or 455) corresponds to output 899. In normal operating mode, a comparatively lower gain is used. Thus, output 355 (or 455) in normal operating mode corresponds to output 812.

Figure 9:
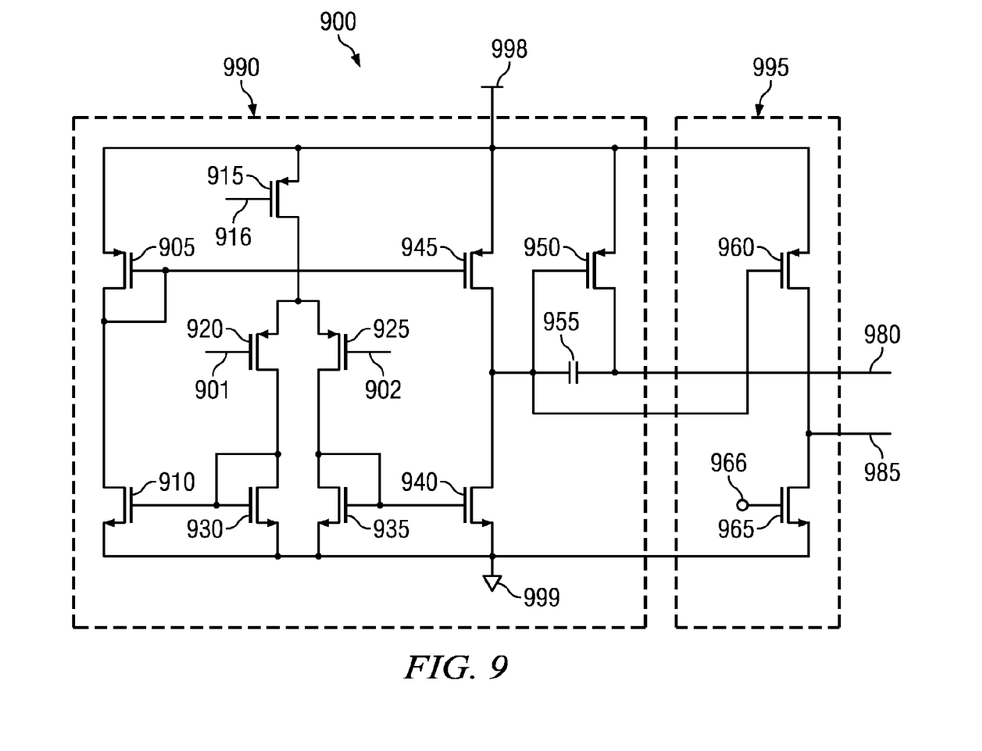
FIG. 9 is a circuit diagram of an implementation of an amplifier used in a DLL in an embodiment.

FIG. 9 is a circuit diagram of an implementation of amplifier 800 in an embodiment. Amplifier 900 of FIG. 9 is shown containing stages 990 and 995. Stage 990 is shown containing PMOS 905, 915, 920, 925, 945 and 950, NMOS 910, 930, 935 and 940, and capacitor 955. Terminals 901 and 902 represent the differential input terminals of amplifier 900, and correspond to terminals 351 and 352 of amplifier 350 of FIGS. 3, and 451 and 452 of amplifier 450 of FIG. 4. Node 916 is connected to a bias voltage. Output of stage 990 is provided on path 980. Path 980 corresponds to path 812 of FIG. 8, and provides the output of the amplifier in normal operation. Capacitor 955 is used for providing compensation to stabilize the overall DLL loop, when amplifier 900 is used in a DLL.

Stage 995 is shown containing PMOS 960 and NMOS 965. Node 966 is connected to a bias voltage. Output of stage 995 is provided on path 985, and corresponds to path 899 of FIG. 8. Path 995 provides the output of the amplifier in the calibration mode.

In the illustrations of FIGS. 3, 4, 5, 7A and 9, although terminals/nodes are shown with direct connections to various other terminals, it should be appreciated that additional components (as suited for the specific environment) may also be present in the path, and accordingly the connections may be viewed as being electrically coupled to the same connected terminals.

It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, NMOS transistors and PMOS transistors may be swapped, while also interchanging the connections to power and ground terminals. Accordingly, in the instant application, the power and ground terminals are referred to as constant reference potentials, the source (emitter) and drain (collector) terminals (through which a current path is provided when turned ON and an open path is provided when turned OFF) of transistors are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A method of calibrating a DLL, the DLL comprising a phase detector having a reference input and a feedback input, the phase detector being designed to generate a pair of error signals representing a phase difference between signals received on the reference input and the feedback input, the DLL also comprising an amplifier having a first input and a second input, the amplifier being designed to amplify the difference of voltages at the first input and the second input, a first error signal of the pair being provided on a first path to the first input and a second error signal of the pair being provided on a second path to the second input, the method comprising:
 providing an identical signal on both of the reference input and the feedback input;
 examining an output of the amplifier to identify a first comparison result between the voltages on the first input and the second input; and
 changing an electrical characteristic of the signal on at least one of the first path and the second path until a second comparison result is obtained at the output of the amplifier.

2. The method of claim 1, wherein the changing changes the electrical characteristic by a first magnitude, the method further comprising effecting change of the electrical characteristic by the first magnitude during normal operation of the DLL.

3. The method of claim 2, wherein the changing an electrical characteristic comprises introducing a current in one of the first path and the second path.

4. The method of claim 2, wherein the changing an electrical characteristic comprises introducing a delay in one of the first path and the second path.

5. A delay locked loop (DLL) comprising:
 a phase detector having a reference input and a feedback input, the phase detector being designed to generate a pair of error signals representing a phase difference between signals received on the reference input and the feedback input;
 an amplifier having a first input and a second input, wherein the first input is coupled via a first path to receive a first error signal in the pair and the second input is coupled via a second path to receive a second error signal in the pair, wherein the amplifier is designed to amplify the difference of voltages at the first input and the second input;
 a measurement block; and
 a correction block,
 wherein, in a configuration phase of the DLL, a same signal is provided on both of the reference input and the feedback input, the measurement block being coupled to an output of the amplifier to identify a first comparison result between voltages on the first input and the second input of the amplifier, the correction block designed to operate to change an electrical characteristic of the signal on at least one of the first path and the second path until a second comparison result is obtained at the output of the amplifier.

6. The DLL of claim 5, wherein the correction block changes the electrical characteristic by a first magnitude in the configuration phase, the DLL of claim 5 further comprising:
 a first filter coupled in the first path between the phase detector and the amplifier to low-pass filter a first error signal in the pair to generate a first filtered signal at the first input;
 a second filter coupled in the second path between the phase detector and the amplifier to low-pass filter a second error signal in the pair to generate a second filtered signal at the second input;
 a delay line comprising a plurality of delay elements, the delay line coupled to receive a reference signal and to generate a plurality of phase-delayed signals, the plurality of phase-delayed signals comprising a feedback signal,
 wherein, in a normal mode of operation of the DLL, the phase detector is coupled to receive the reference signal on the reference input, and the feedback signal on the feedback input, the measurement block being decoupled from the output of the amplifier, wherein the output of the amplifier is coupled to the delay line to control a delay of each delay element in the delay line, and
 wherein the correction block effects a change of the electrical characteristic by the first magnitude in the normal mode of operation.

7. The DLL of claim 6, wherein the correction block is a current DAC (digital to analog converter), wherein the current DAC introduces a current to change the electrical characteristic of the signal on at least one of the first path and the second path.

8. The DLL of claim 7, wherein the current causes a voltage drop across a resistor comprised in one of the first filter and the second filter.

9. The DLL of claim 6, wherein the correction block comprises a first delay block and a second delay block, wherein an input of the first delay block is coupled to receive the reference signal and an output of the first delay block coupled to the reference input of the phase detector,
 wherein an input of the second delay block is coupled to receive the feedback signal and an output of the second delay block is coupled to the feedback input of the phase detector,
 wherein one or both of the first delay block and the second delay block adds a delay to the respective ones of signals on the first path and the second path to change the electrical characteristic of the signal on at least one of the first path and the second path.

10. The DLL of claim 6, wherein the amplifier is designed to have a higher gain in the calibration phase than in the normal mode of operation.

11. The DLL of claim 6, wherein, when the reference signal is aligned to be in-phase with the feedback signal, the phase detector generates each of the first error signal and the second error signal with an overlap time equal to half the period of the reference signal.

12. The DLL of claim 10, wherein the phase detector is designed to cause the first error signal to transition to a logic high level at a rising edge of the reference signal, the second error signal to transition to a logic high level at a rising edge of the feedback signal, and each of the first error signal and the second error signal to transition to a logic low at a falling edge of either the reference signal or the feedback signal.

13. A delay locked loop (DLL) comprising:
 a phase detector to receive a reference signal on a reference input and a feedback signal on a feedback input, the phase detector being designed to generate a pair of error signals representing a phase difference between signals received on the reference input and the feedback input;

a first filter coupled to low-pass filter a first error signal in the pair to generate a first filtered signal;

a second filter coupled to low-pass filter a second error signal in the pair to generate a second filtered signal;

an amplifier coupled to receive the first filtered signal on a first input and the second filtered signal on a second input, the amplifier being designed to amplify a difference of the first filtered signal and the second filtered signal, and to provide a first amplified output on a first output terminal and a second amplified output on a second output terminal; and a delay line comprising a plurality of delay elements, the delay line coupled to receive the reference signal and to generate a plurality of phase-delayed signals, the plurality of phase-delayed signals comprising the feedback signal, wherein the first amplified output is coupled to the delay line to control a delay of each delay element in the delay line, wherein the phase detector is designed to cause the first error signal to transition to a logic high level at a rising edge of the reference signal, the second error signal to transition to a logic high level at a rising edge of the feedback signal, and each of the first error signal and the second error signal to transition to a logic low at a falling edge of either the reference signal or the feedback signal.

14. The DLL of claim 13, further comprising:
a measurement block and a correction block,
wherein, in a configuration phase of the DLL, a same signal is provided on both of the reference input and the feedback input, the measurement block being coupled to an output of the amplifier to identify a comparison result between voltages on the first input and the second input of the amplifier, the correction block designed to introduce a current incrementally into one of the first input and the second input to correct an offset error in the DLL.

15. The DLL of claim 14, wherein the measurement block and the correction block operate iteratively to identify the comparison result and to introduce the current incrementally until a second comparison result is obtained at the output of the amplifier.

16. The DLL of claim 15, wherein, in normal operation of the DLL, the correction block is designed to inject into one of the first node and the second node a value of current that caused the second comparison result.

17. The DLL of claim 16, wherein the correction block is a current DAC (digital to analog converter.

18. A phase detector in a delay locked loop (DLL), the phase detector to receive a reference signal on a reference input and a feedback signal on a feedback input, and to generate a pair of error signals representing a phase difference between signals received on the reference input and the feedback input, the phase detector comprising:

a first flip-flop, wherein a data input of the first flip-flop is coupled to a power supply terminal, and a clock input of the first flip-flop being coupled to receive a reference signal, wherein the output of the first flip-flop is a first error signal in the pair;

a second flip-flop, wherein a data input of the second flip-flop is coupled to the power supply terminal, and a clock input of the second flip-flop being coupled to receive the feedback signal, wherein the output of the second flip-flop is a second error signal in the pair;

a NAND gate coupled to receive the reference clock and the feedback clock as inputs;

a first AND gate coupled to receive the first error signal and the second error signal as inputs; and a second AND gate to receive the outputs of the NAND gate and the AND gate as inputs, wherein an output of the second AND gate is coupled to the asynchronous clear inputs of each of the first flip-flop and the second flip-flop.

19. The phase detector of claim 18, wherein each of the first error signal and the second error signal is coupled to a charge pump.

20. A phase detector in a delay locked loop (DLL), the phase detector to receive a reference signal on a reference input and a feedback signal on a feedback input, and to generate a pair of error signals representing a phase difference between signals received on the reference input and the feedback input, the pair of error signals comprising a first error signal and a second error signal, wherein the phase detector is designed to cause the first error signal to transition to a logic high level at a rising edge of the reference signal, the second error signal to transition to a logic high level at a rising edge of the feedback signal, and each of the first error signal and the second error signal to transition to a logic low at a falling edge of either the reference signal or the feedback signal.

* * * * *